(12) United States Patent
Hellig et al.

(10) Patent No.: US 7,130,762 B2
(45) Date of Patent: Oct. 31, 2006

(54) METHOD AND SYSTEM FOR HANDLING SUBSTRATES IN A PRODUCTION LINE INCLUDING A CLUSTER TOOL AND A METROLOGY TOOL

(75) Inventors: Kay Hellig, Dresden (DE); Peter Goerigk, Dresden (DE); Uwe Liebold, Kleinroehrsdorf (DE); Ronald Gruenz, Dresden (DE); Karl-Heinz Fandrey, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 657 days.

(21) Appl. No.: 10/360,314

(22) Filed: Feb. 7, 2003

(65) Prior Publication Data

US 2004/0044435 A1 Mar. 4, 2004

(30) Foreign Application Priority Data

Aug. 30, 2002 (DE) ................ 102 40 115

(51) Int. Cl.
*G06F 17/18* (2006.01)
*G06F 19/00* (2006.01)

(52) U.S. Cl. .................... 702/182; 702/179

(58) Field of Classification Search ........ 438/908; 702/127, 182, 189, 81, 83, 179; 700/51
See application file for complete search history.

(56) References Cited

U.S. PATENT DOCUMENTS

| | | | |
|---|---|---|---|
| 6,556,949 B1 * | 4/2003 | Lyon ................ | 702/182 |
| 6,689,519 B1 * | 2/2004 | Brown et al. ........ | 430/30 |
| 6,806,971 B1 * | 10/2004 | Finarov ............ | 356/636 |
| 6,841,403 B1 * | 1/2005 | Tanaka et al. ...... | 438/14 |

FOREIGN PATENT DOCUMENTS

| | | |
|---|---|---|
| DE | 196 39 892 C1 | 2/1998 |
| WO | WO 01/35449 A1 | 5/2001 |
| WO | WO 01/50206 A1 | 7/2001 |

* cited by examiner

*Primary Examiner*—Michael Nghiem
*Assistant Examiner*—Douglas N Washburn
(74) *Attorney, Agent, or Firm*—Williams, Morgan & Amerson, P.C.

(57) ABSTRACT

In a production line, a cluster tool having a plurality of substantially identical process modules and a metrology tool includes a control unit that allows one to receive, store and process information that indicates in which process module which substrates have been processed and which selects, on the basis of the process information, which substrate has to be subjected to a measurement. Advantageously, the substrates are selected so that each process module is represented by a corresponding substrate to be measured in order to reliably monitor the process quality of each process module.

19 Claims, 2 Drawing Sheets

METHOD AND SYSTEM FOR HANDLING SUBSTRATES IN A PRODUCTION LINE INCLUDING A CLUSTER TOOL AND A METROLOGY TOOL

BACKGROUND OF THE INVENTION

1. Field of the Invention

The present invention generally relates to the field of fabricating mass products, such as integrated circuits, wherein a plurality of manufacturing and metrology steps are carried out by corresponding process tools and metrology tools. More particularly, the present invention relates to the substrate handling in a production line including at least one cluster tool having a plurality of process modules to increase throughput.

2. Description of the Related Art

In manufacturing mass products, a plurality of process steps are typically required wherein control measurements have to be performed on a regular basis to ensure product quality. A typical example for a technologically sophisticated mass production is the fabrication of integrated circuits in which a huge number of quite complex processes are carried out that may be preceded or followed by corresponding metrology steps to precisely monitor the quality of respective process sequences. Process quality and, thus, product quality, however, is only one issue that has to be taken into account by semiconductor manufacturers. A further important criterion for the economic success of a product is the overall throughput achieved in the semiconductor production line. For this reason, so-called cluster tools are increasingly employed which may have a plurality of substantially identical process modules to process a plurality of substrates in a substantially parallel manner.

FIG. 1 shows a simplified schematic view of a typical cluster tool that may be used for etching semiconductor substrates. In FIG. 1, a cluster tool 100 comprises a substrate handling platform 101 which is also referred to as a mainframe. Attached to the mainframe 101 are a substrate input port 102 and a substrate output port 103. Typically, the ports 102, 103 are configured to receive a predefined number of substrates provided in a corresponding substrate carrier (not shown). A typical number of substrates within one carrier, also referred to as a lot, is 25. The cluster tool 100 further comprises a plurality of process modules 104, which in the present example are substantially identical etch chambers indicated by a, b, c and d. It should be noted, however, that the cluster tool 100 may comprise additional process modules that may not be identical to the modules 104. Such additional process modules may, for example, represent a clean or rinse station provided upstream and/or downstream of the process module 104.

The operation of the cluster tool 100 will be described with reference to the formation of contact vias, which in sophisticated integrated circuits requires the etching of high aspect ratio openings having a diameter of approximately 0.1 μm or even less. A typical process flow for etching the contact vias with metrology steps associated therewith will now be described with reference to FIG. 2.

In FIG. 2, a process sequence 200 is illustrated in a simplified form to produce vias having a specified critical design dimension (CD), i.e., having a specified diameter. For convenience, only the relevant steps of the process sequence 200 are illustrated in FIG. 2. In step 201, a mask is created on the substrates by sophisticated photolithography techniques so that the vias may be etched into the underlying material layer or layers using this mask. In step 202, the critical dimension, i.e., the diameter of the openings of the mask, are measured, for example, by employing metrology tools, e.g., via optical measurement instruments such as scatterometers and the like. Thereafter, in step 203, the vias are formed by etching the substrates. To this end, a predefined number of substrates, for example, a lot, is provided to the input port 102 and is distributed among the plurality of process modules 104. Although the modules a, b, c and d are substantially identical, the process parameters and, thus, the process conditions in each of the modules may more or less vary, which may result in a different product quality and in slightly different process times. For an optimized tool utilization, the cluster tool 100 is typically configured so as to obtain a maximum number of processed substrates per time, requiring the decision on which substrate is delivered to which process module to be made on the basis of the current status of the individual process modules 104. Thus, it may hardly be predetermined which wafer is loaded in which process module without significantly lowering the throughput of the cluster tool 100.

After completion of the via etch in step 204, a so-called defect scan may be performed to monitor the level of any defects that may be caused by by-products generated in one of the process modules 104. In step 205, the critical dimension of the actual via is measured, for example, by a scatterometer and the like, thereby detecting any drifts of parameters during the via etch process in step 203, which may be caused, for example, by a pressure variation or the like. An increased measurement sensitivity to a parameter drift during the process sequence 200 may be obtained by determining the difference of the critical dimension of the via mask obtained in step 202 and the critical dimension of the actual via obtained in step 205.

As previously noted, the process modules a, b, c and d may be substantially identical; however, these process modules are operated largely independently so that variations in the process sequence 200 may be caused by some of the process modules 104, whereas others are still operating within the tightly set process conditions. An illustrative example for an operation sequence of two substrate lots, each including 25 substrates, may be as follows. For a lot I, the substrates may be processed by the modules a, b, c and d according to Table 1.

TABLE 1

| Substrate | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| Module | A | B | C | D | A | B | C | D | A | B | C | D | A | B | C | D | A | B | C | D | A | B | C | D | A |

A lot II may be processed by the modules a, b, c and d according to Table 2, wherein, as an example, module b may have been taken offline after etching substrate 6 owing to, e.g., a measurement event indicating a high defect level generated in module b.

TABLE 2

| Substrate | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| Module | A | B | C | D | A | B | C | A | C | D | A | C | D | A | C | D | A | C | D | A | C | D | A | C | D |

For economical reasons, not all processed substrates are measured in the process monitor measurement steps 202, 204 and 205. Instead, a so-called lot sampling rate is defined which indicates a certain fraction of all lots to be subjected to the metrology operations. Typically, only a few substrates from each lot selected for metrology are actually measured and may have been picked randomly or according to frequently used selection schemes such as: measuring substrates from defined slots of the substrate carrier, for example, slots 5, 10 and 15; measuring the first and the last substrate of the lot; or measuring always the same substrate throughout the whole process sequence 200, i e., in step 202 and step 204 the same substrate or substrates are measured.

These schemes for selecting the substrate to be measured may not allow the operation conditions to be monitored in each of the modules a, b, c and d on a regular basis as the designation of a process module to a substrate depends on the cluster tool 100. This means that recognition of a parameter drift of a process module beyond the tightly set process conditions may be unduly delayed, thereby significantly adversely affecting the yield of the process sequence 200. This problem will be illustrated by the following example. It is assumed that the lot sampling is set to 25%, i.e., every fourth lot receives a CD measurement 202 and 205 and a defect scan 204.

It is further assumed that the substrates in slots 5, 10 and 15 are to be selected for these measurements. A plurality of lots, indicated by L1, L2, L3 . . . may be processed in the cluster tool 200, wherein the wafers of lot L1 to be measured have been processed by process modules a, b and d. Upon processing lot L2, process module d may start contaminating the substrates with particles due to any by-products produced in this chamber. Hence, as the lot sampling rate is set to 25%, L2, L3 and L4 are not measured, and only L5 is measured again. The substrates measured in lot L5 placed to slots 5, 10 and 15 may represent process modules c, a and b. Thus, the increased defect level generated by process module d is not detected. Subsequently, lots L6, L7 and L8 are processed but not measured. The three substrates from lot L9 may then represent the modules b, c and a, so that again the increased defect level created by module d is not detected. The next lot to be measured is L13, while lot L14 is already etched by the cluster tool 100, wherein finally one of the substrates processed in process module d may be in one of slots 5, 10 and 15 and will be subjected to measurement. The high defect level is now detected and module d may be taken offline.

In this illustrative example, 13 lots have been processed after the first occurrence of a non-tolerable defect level in module d, until finally module d has been identified as producing substrates not fulfilling the specifications compared to only 31 substrates (5 lots) that would have ideally been affected under the given lot sampling rate. It should be noted that the illustrative example described above represents a reasonable average value for the "picking" probability. In other cases the number of "out-of-specification" substrates may be higher or lower, but in the long run significantly higher than the number of defect substrates generated under ideal measurement conditions. Since typically the defect lot sampling rate is selected to provide for a reasonable compromise between economic concerns and an acceptable risk for the occurrence of defect substrates, in using cluster tools within a manufacturing sequence, the lot sampling rate has to be sufficiently increased, thereby reducing throughput.

In view of the above-described problems, it is, therefore, highly desirable to provide methods and systems that allow an efficient utilization of cluster tools without unduly increasing the number of substrates that do not meet the process specification.

SUMMARY OF THE INVENTION

In general, the present invention is directed to a method and a system to monitor each process module of a cluster tool on a regular basis so that, for a given lot sampling rate, the risk for producing workpieces, such as substrates, not meeting the process requirements is given by the lot sampling rate only, independent of the scheme for selecting a substrate to be measured within a lot.

According to one illustrative embodiment of the present invention, a method of handling workpieces is provided wherein the method comprises supplying a plurality of workpieces to a cluster tool having a plurality of process modules. The workpieces are then processed in at least some of the process modules and process information is stored, indicating for each processed workpiece the process module in which each workpiece has been processed. Moreover, some of the processed workpieces are selected for measurement in a metrology tool on the basis of the process information.

According to a further illustrative embodiment of the present invention, a method of operating a cluster tool in a production line is provided wherein the cluster tool includes a plurality of substantially identical process modules. The method comprises receiving a plurality of workpieces and processing the workpieces with at least some of the plurality of process modules such that a throughput of the cluster tool is optimized. Process information is stored, indicating for each of the workpieces the corresponding process module in which each of the workpieces has been processed. Additionally, measurement data is received from workpieces selected for measurement on the basis of the process information, wherein the measurement data is used to establish a statistical process control chart for each process module.

In yet a further illustrative embodiment of the present invention, a system for processing workpieces in a production line comprises a cluster tool including a plurality of process modules and a metrology tool. A control unit is provided in communication with the cluster tool and the metrology tool, wherein the control unit is configured to receive, store and provide process information indicating for each workpiece the process module that has been used for processing each workpiece.

BRIEF DESCRIPTION OF THE DRAWINGS

The invention may be understood by reference to the following description taken in conjunction with the accompanying drawings, in which like reference numerals identify like elements, and in which.

Figure 1:
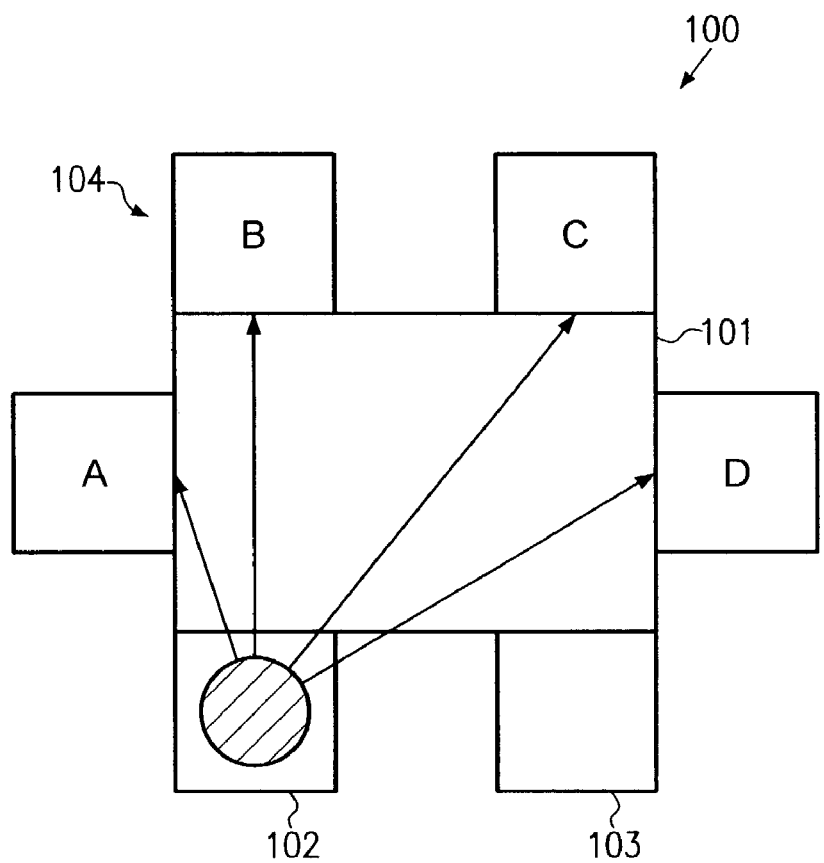
FIG. 1 schematically shows a cluster tool as used in the fabrication of integrated circuits.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various structures of the semiconductor device and the implant regions are depicted in the drawings as having very precise, sharp configurations and profiles, those skilled in the art recognize that, in reality, these regions and structures may not be as precise as indicated in the drawings. Additionally, the relative sizes of the various features and implant regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In the following, further illustrative embodiments of the present invention will be described in more detail. In these embodiments, it is referred to the fabrication or fabrication sequences involved in producing integrated circuits. The present invention is, however, not to be considered as limited to these cases. Rather, the present invention is applicable to any process for fabrication of mass products, especially in fabrication sequences requiring the formation and patterning of material layers with high precision. Thus, the present invention is also applicable to the field of micromechanics, surface treatment of products, nanotechnology, and the like. Moreover, in the illustrative embodiments explained below, reference will be made to a cluster tool including a plurality of substantially identical process modules configured as etch chambers for anisotropically patterning circuit features. It is to be understood, however, that the principles of the present invention may be applied to any type of cluster tool as well, including at least two process modules performing the same task on substrates supplied thereto.

Figure 3:
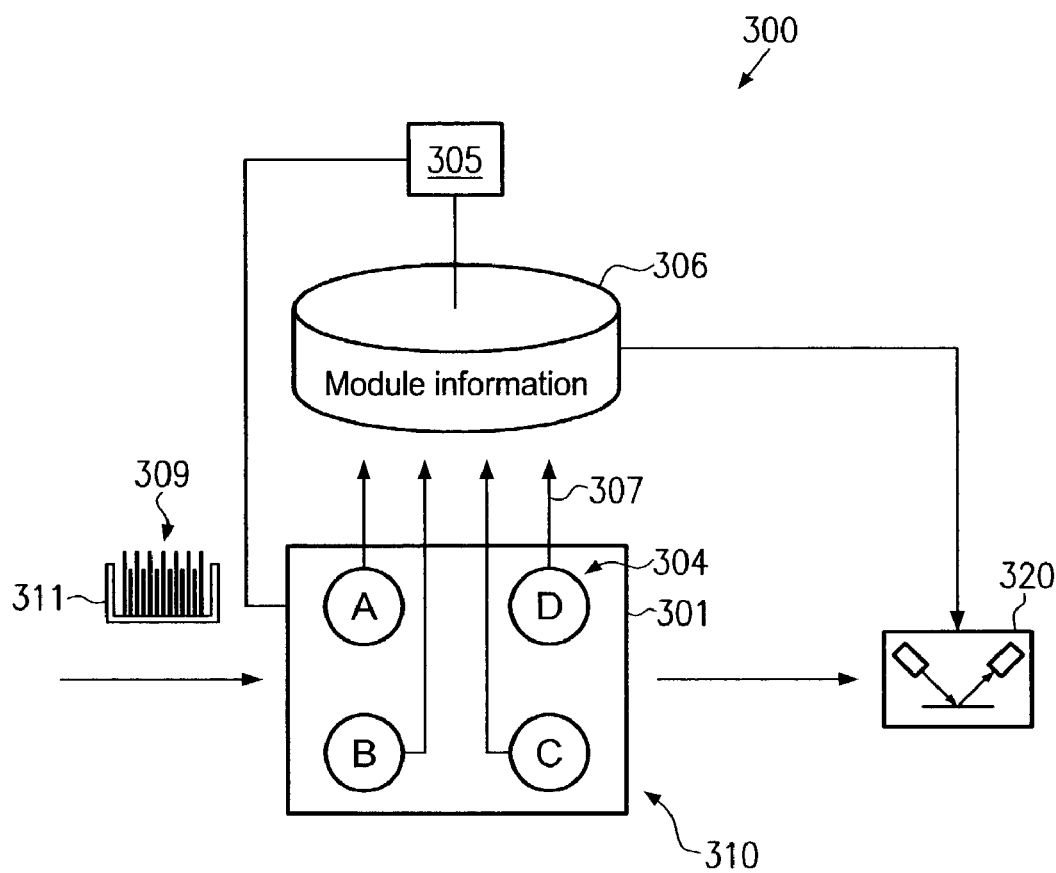
FIG. 3 schematically depicts a system including a cluster tool and a metrology tool in accordance with one illustrative embodiment of the present invention.

FIG. 3 schematically shows, in a very simplified manner, a system 300 for carrying out a process or process sequence required for the fabrication of an integrated circuit. The system 300 comprises a cluster tool 310 including four process modules 304 that are incorporated in a mainframe 301. The process modules, in the present example representing etch chambers, are also indicated by a, b, c and d, and are configured to operate substantially independently from each other. The process modules 304 are further configured to receive a substrate 309 contained in a substrate carrier 311, wherein the supply of the substrate 309 to each of the process modules 304 is controlled by a control unit 305, typically designed to optimize throughput of the cluster tool 310.

The control unit 305 is coupled to a database unit 306, which is configured to receive process information from the process modules a, b, c and d, as is indicated by arrows 307. The process information gathered by the database unit 306 at least includes the information about which substrate has been processed in each of the modules 304. Moreover, a metrology tool 320 is provided that is appropriate for carrying out the required measurements. For instance, if the defect level of the substrates 309 processed by the modules a, b, d and c has to be monitored, metrology tool 320 may be an optical instrument, for example, including a microscope. In other cases, the metrology tool 320 may be an ellipsometer or it may be a scatterometer or an electron microscope.

In operation, a predefined number of the substrates 309 is supplied to the cluster tool 310, for example, contained in the substrate carrier 311. Typically, the substrates 309 are delivered in certain "quantities," such as 25 per substrate carrier 311, but any other way to provide the substrates 309 is also appropriate. For example, the substrates 309 may be provided substantially "continuously" by providing a plurality of substrate carriers, which in total contain the predefined number of substrates, without the necessity of dividing the substrates into "lots." Upon arrival of the substrates 309, the control unit 305 effects loading of the substrate 309 into a respective one of the process modules 304 by means of a substrate handler (not shown). Since the control unit 305 is configured to achieve an optimum throughput through the cluster tool 310, the order of providing substrates 309 to a specific process module, for example, module a, depends on the process conditions of the plurality of process modules and may significantly deviate from an ordered sequence, especially when one or more of the process modules 304 have to be taken offline or have been taken offline for a certain time period. A corresponding designation of process modules to substrates may have the form as previously described with reference to Table 2. Thus, determining, for example, four slots in the substrate carrier 311 as "control" substrates for performing measurements with the metrology tool 320 in accordance with the lot sampling rate established in advance may most likely lead to a situation as explained above with reference to FIGS. 1 and 2. For this reason, the process information 307 is provided to the database unit 306 to record which substrate has been processed in which module. The process information may be provided in the form of a table, such as the Tables 1 and 2 described earlier. If, for example, the lot sampling rate is set to 20%, i.e., every fifth lot is to be measured, the control unit 305 or the database unit 306 may then automatically pick four substrates that have been processed by the respective process modules a, b, c and d.

In one embodiment, the control unit 305 or the database unit 306 are configured to receive a process recipe or at least a part of the process recipe referring to lot sampling rates required for the process sequence under consideration. The control unit 305 or the database unit 306 may then be configured to indicate, on the basis of the process recipe or the portion thereof, which substrates have to be subjected to a subsequent measurement process that is to be carried out by the metrology tool 320.

In other embodiments, the substrates 309 may be supplied continuously to the cluster tool 310 and the lot sampling rate may be replaced by a substrate sampling rate, and the corresponding control substrates are picked in accordance with the substrate sampling rate such that each of the process modules 304 is "covered" by the same number of control substrates within a certain time interval. While performing the process sequence on a lot basis is advantageous in terms of tool utilization (for example, providing only one substrate from a lot requires a large amount of loading and de-loading activity at the metrology tool 320), performing the measurement procedure on a substrate basis provides for a more continuous monitoring of the cluster tool 310. For example, a given substrate sampling rate may require the measurement of every $30^{th}$ substrate. The control unit 305 or the database unit 306 may then pick an appropriate substrate that is in the "vicinity" of the thirtieth substrate such that each selected substrate successively covers one of the process modules 304. Hence, each process module is then represented after approximately 120 substrates.

In one embodiment, the database unit 306 is operatively coupled to the metrology tool 320, wherein the process information and/or an identification of the substrate 309 to be measured is directly provided to the metrology tool 320 so as to automatically select the appropriate substrate for measurement. In some embodiments, the database unit 306 may be connected to the control unit 305 and/or the metrology tool 320 via a local area network, whereas in yet other embodiments, a facility management system may be provided that receives the process information 307 and selects the substrates to be measured on the basis of this process information 307 and the required sampling rate. Moreover, in other embodiments, the sampling rate may be updated on the basis of measurement results obtained from the metrology tool 320. For instance, if the measurement results indicate a parameter shift that is still within the tolerances, the sampling rate may be increased to more precisely monitor the further development of this shift. In other embodiments, the sampling rate may be updated in accordance with any further measurement results or process conditions upstream or downstream of the system 300 detected by a facility management system so as to adjust the "degree" of process monitoring to the actual process conditions of a larger portion or the entire process flow of which the system 300 represents a part. For instance, measurements may have revealed process fluctuations in a preceding process, for example, a deposition process, so that a more thorough control of the etch process in the cluster tool 310 is required. Accordingly, the facility management system may increase the sampling rate to provide for a tighter "control loop."

Figure 2:
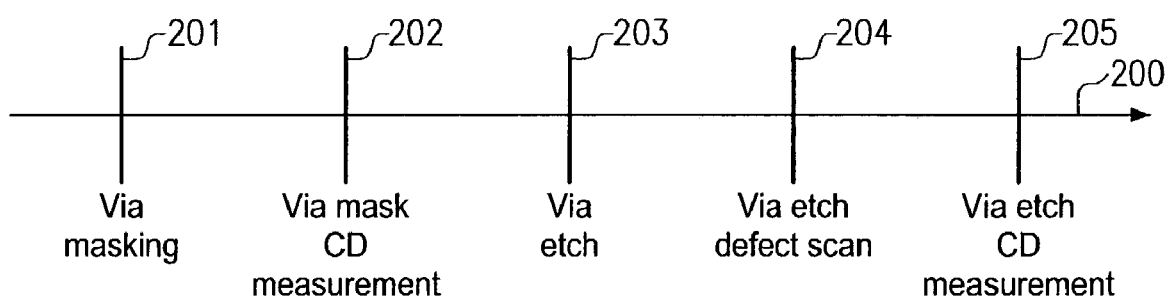
FIG. 2 schematically illustrates a process sequence for forming contact vias in semiconductor substrates.
Figure 4:
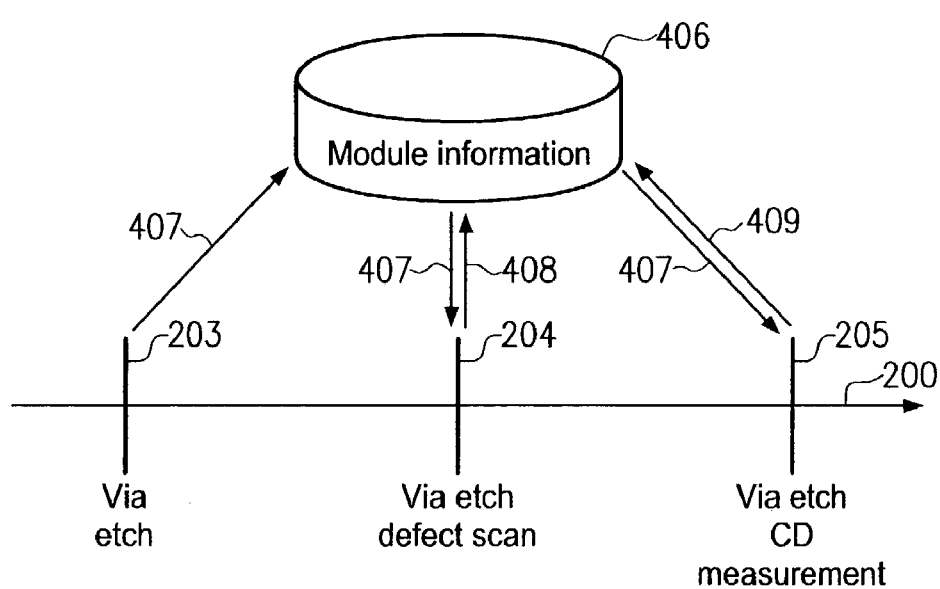
FIG. 4 schematically illustrates a typical process sequence in accordance with a further illustrative embodiment of the preset invention when applied to the formation of vias in semiconductor substrates.

FIG. 4 schematically depicts a process flow similar to the flow shown in FIG. 2 wherein, for the sake of convenience, the same reference numerals are used for the same or similar process steps. The process flow 200 includes the via etch step 203 that may be carried out with a cluster tool such as the cluster tool 310 of FIG. 3. In other embodiments, two or more cluster tools may be provided to carry out the via etch and/or process steps preceding the via etch 203 may have been carried out with a further cluster tool. For example, the highly sophisticated photolithography preceding the via etch may be carried out on two or more substantially identical photolithography tools so that these photolithography tools may be considered as a cluster. Process information 407 gathered during the via etch step 203 and possibly gathered during preceding process steps, such as the photolithography step, are delivered to a database 406, which may be implemented in a stand-alone computer connected to the cluster tool or cluster tools and to any metrology tools required for the subsequent measurement of the substrates. The database 406 may also be provided in a facility management system, as explained above, or may be provided in the cluster tool 310 or one of the metrology tools 320. Subsequently, during the via etch defect scan 204, the process information is retrieved from the database 406 and is provided to the corresponding metrology tool so that substrates are selected for the measurement in such a way that all of the process modules of the one or more cluster tools are represented. In one embodiment, measurement results are fed back to the database 406 as measurement information 408 that may be used to individually assess the corresponding process modules. The measurement information 408 may then be incorporated into the process information 407.

Next, the via etch CD measurement 205 is carried out, wherein, as in the preceding step, the process information 407, possibly including the measurement information 408, is provided to the respective metrology tool to select the appropriate substrates to cover all of the process modules. Moreover, measurement results may be returned to the database 406 as measurement information 409 that may be used to separately assess the process modules involved. In assessing the process modules, the measurement information 408 and/or the measurement information 409 or relevant portions thereof may be used to individually establish a statistical process control chart for each of the process modules so that any parameter drift of one of the process modules may be detected more reliably and significantly earlier than by monitoring the cluster tool as a whole. Moreover, as previously described, the measurement information 408 and/or 409 may be used to update the sampling rate in an automated fashion as long as a tool utilization of the metrology tool 320 is less than 100%.

Thus, by employing the process information and by keeping track of which substrate has been processed in which process module, the substrate may be automatically selected for a subsequent measurement such that all of the process modules involved in the process sequence are represented. As a consequence, the probability of missing a process failure is solely determined by the lot sampling rate or the substrate sampling rate rather than by the random distribution of substrates to process modules carried out by the cluster tool. As previously pointed out, when the process flow is organized on a lot basis rather than on a substrate basis, the present invention may require the measuring of a number of substrates per lot that is equal to the process modules used. That is, if a lot sampling rate of 20% is required, in the described examples, four substrates of every fifth lot have to be measured. In other selection schemes, for example, the scheme as shown and illustrated with reference to Tables 1 and 2, only three substrates per lot would have to be measured. However, when using the present invention, the lot sampling rate may be selected significantly lower as each process module is represented in each measurement cycle. Contrary thereto, in the prior art process flow, the monitoring of one or more process modules may be drastically delayed, or may even "never" be monitored due to the random distribution of the substrates to process modules in conformity with throughput optimization carried out by the corresponding cluster tool. Therefore, even if a slightly larger number of substrates per lot is to be measured, in total the number of measurements required may be lowered due to the decreased lot sampling rate, while at the same time providing a significantly higher process control quality. In some embodiments, the lot sampling rates may be selected in view of process control quality and/or in view of metrology tool utilization. That is, for a given metrology tool having a specified throughput, the lot sampling rate may be selected such that substantially the maximum throughput for the required number of substrates per lot is achieved. In this way, a significantly larger number of substrates and thus a remarkably "denser" sampling is obtained than in a conventional lot-based process sequence, as much more time is consumed by substrate loading and de-loading for three or two samples per lot, resulting in a decreased process control quality due to the randomly distributed and thus randomly selected test substrates, and a less dense sampling for a given metrology tool, compared to the present invention.

Moreover, the embodiments described above may also be combined with other substrate selection schemes which still may be justified. It may be quite useful to measure the critical dimension of the via etch on the same substrates that were also selected for the via mask critical dimension measurement (see FIG. 2). The selection of identical substrates allows more precise calculation of the critical dimension bias, i.e., the difference between the two measurements, so that more accurate information related to the photoresist profile and the etch process is obtained. According to the present invention, at the via etch critical dimension measuring step 204, in one embodiment, it is first determined which substrates were measured at the via mask critical dimension step 202. This information may then also be stored as a part of the process information 407 in the database 406. As an illustrative example, it is assumed that according to Table 1, substrates 7, 11 and 18 are measured at the via mask CD measurement 202, which were subsequently etched in process modules c, c and b. For the subsequent via etch CD measurement 205, the system then determines, on the basis of the information stored, those substrates which have to be subjected to the measurement. Since the process modules b and c are already represented by the substrates 7, 11 and 18, only the process modules a and d have to be represented by corresponding substrates. A possible choice would be substrate 21 (process module a) and substrate 16 (process module b). Finally, substrates 7, 11, 16, 18 and 21 are used for the measurement cycle of step 205 so that information is obtained relating to both the quality of the entire process sequence determined by the CD difference and to the performance of the individual process modules of the cluster tool. In this way, the measurement step 205 produces a maximum level of information for the number of substrates that are measured.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of handling workpieces, the method comprising:
supplying a plurality of workpieces to a cluster tool having a plurality of process modules;
processing the workpieces in at least some of the process modules;
storing process information indicating for each processed workpiece the process module in which each said workpiece has been processed;
selecting some of the processed workpieces for measurement in a metrology tool on the basis of said process information; and
sampling said plurality of workpieces at a sampling rate selected to optimize throughput of said metrology tool.

2. The method of claim 1, wherein at least one workpiece for each of said at least some process modules is selected for measurement.

3. The method of claim 1, further comprising measuring some of the workpieces prior to processing the workpieces in the at least some of the process modules and storing at least information indicating which workpieces have been measured as part of said process information.

4. The method of claim 1, further including measuring said selected some of the workpieces and storing measurement information indicative of the measurement results.

5. The method of claim 4, wherein a statistical process control chart is established for each of said modules on the basis of the process information and the measurement information.

6. The method of claim 1, wherein said plurality of workpieces is provided as a plurality of workpiece lots.

7. The method of claim 6, wherein said some of the workpieces are selected such that each of said at least some of the process modules is represented by one workpiece lot.

8. The method of claim 5, wherein said at least some of the process modules are represented by two or more workpiece lots.

9. The method of claim 1, further comprising selecting, in advance, at least one workpiece to be measured, wherein selecting some of the workpieces for measurement includes selecting workpieces that have been processed in process modules other than the process module used for processing said at least one workpiece selected in advance.

10. A method of operating a cluster tool in a production line, the cluster tool including a plurality of substantially identical process modules, the method comprising:
receiving a plurality of workpieces;
processing the workpieces with at least some of the plurality of process modules such that a throughput of the cluster tool is optimized;
storing process information indicating for each of the workpieces the corresponding process module in which each of the workpieces has been processed; and
receiving measurement data from workpieces selected for measurement on the basis of said process information, wherein said measurement data is used to output a statistical process control chart for each process module.

11. The method of claim 10, wherein at least one workpiece for each of said at least some process modules is selected for measurement.

12. The method of claim 10, further comprising measuring some of the workpieces prior to processing the workpieces in the at least some of the process modules and storing at least the information indicating which workpieces have been measured as part of said process information.

13. The method of claim 10, wherein said plurality of workpieces is provided as a plurality of workpiece lots.

14. The method of claim 13, wherein said some of the workpieces are selected such that each of said at least some of the process modules is represented by one workpiece lot.

15. The method of claim 13, wherein said at least some of the process modules are represented by two or more workpiece lots.

16. The method of claim 10, further comprising selecting, in advance, at least one workpiece to be measured, and selecting workpieces that have been processed in process modules other than the process module used for processing said at least one workpiece selected in advance.

17. The method of claim 10, further comprising determining a sampling rate for said plurality of workpieces.

18. A system for processing workpieces in a production line, comprising:
a cluster tool including a plurality of process modules;
a metrology tool; and
a control unit in communication with said cluster tool and said metrology tool, the control unit being configured to receive, store and provide process information indicating for each workpiece the process module that has been used for processing each workpiece, wherein said control unit is further configured to select some of the workpieces for measurement in said metrology tool on the basis of a process recipe and said process information to optimize a throughput of at least one of the cluster tool and the metrology tool.

19. The system of claim 18, wherein said control unit is further configured to instruct said metrology tool to measure said selected workpieces.

* * * * *